(12) United States Patent
Park et al.

(10) Patent No.: US 10,002,905 B2
(45) Date of Patent: Jun. 19, 2018

(54) DATA STORAGE DEVICES

(71) Applicants: Jongsoon Park, Suwon-si (KR);
Sang-Kuk Kim, Seongnam-si (KR);
Jong-Kyu Kim, Seongnam-si (KR);
Jongchul Park, Seongnam-si (KR);
Woohyun Lee, Seoul (KR); Yil-hyung Lee, Hwaseong-si (KR)

(72) Inventors: Jongsoon Park, Suwon-si (KR);
Sang-Kuk Kim, Seongnam-si (KR);
Jong-Kyu Kim, Seongnam-si (KR);
Jongchul Park, Seongnam-si (KR);
Woohyun Lee, Seoul (KR); Yil-hyung Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/431,234

(22) Filed: Feb. 13, 2017

(65) Prior Publication Data
US 2017/0345869 A1 Nov. 30, 2017

(30) Foreign Application Priority Data
May 27, 2016 (KR) .................... 10-2016-0065881

(51) Int. Cl.
| H01L 43/00 | (2006.01) |
| H01L 27/22 | (2006.01) |
| H01L 43/02 | (2006.01) |
| H01L 43/08 | (2006.01) |
| G11C 11/16 | (2006.01) |
| H01L 43/10 | (2006.01) |

(52) U.S. Cl.
CPC .......... *H01L 27/222* (2013.01); *G11C 11/161* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; G11C 11/161
See application file for complete search history.

(56) References Cited

U.S. PATENT DOCUMENTS

| 8,574,928 | B2 | 11/2013 | Satoh et al. |
| 8,941,195 | B2 | 1/2015 | Lee et al. |
| 8,975,089 | B1 | 3/2015 | Jung et al. |
| 9,166,154 | B2 | 10/2015 | Satoh et al. |
| 2015/0014800 | A1 | 1/2015 | Satoh et al. |
| 2015/0021726 | A1 | 1/2015 | Min et al. |
| 2015/0035031 | A1 | 2/2015 | Kim |
| 2015/0069560 | A1* | 3/2015 | Cho ........................ H01L 43/02 257/421 |
| 2015/0287911 | A1 | 10/2015 | Kim et al. |
| 2016/0035969 | A1 | 2/2016 | Kang et al. |
| 2016/0043306 | A1 | 2/2016 | Huang et al. |
| 2016/0056370 | A1 | 2/2016 | Wu et al. |

* cited by examiner

*Primary Examiner* — Samuel Gebremariam
(74) *Attorney, Agent, or Firm* — Myers Bigel, P.A.

(57) ABSTRACT

Data storage devices are provided. A data storage device includes a dielectric layer on a substrate. The data storage device includes a plurality of data storage structures on the dielectric layer. The data storage device includes a conductive material on the dielectric layer. Moreover, the data storage device includes an insulation layer on the conductive material.

20 Claims, 10 Drawing Sheets

DATA STORAGE DEVICES

CROSS-REFERENCE TO RELATED APPLICATION

This U.S. nonprovisional patent application claims priority under 35 U.S.C. § 119 of Korean Patent Application 10-2016-0065881 filed on May 27, 2016, the entire contents of which are hereby incorporated herein by reference.

BACKGROUND

The present disclosure relates to semiconductor devices. Semiconductor devices are beneficial in the electronic industry due to their small size, multi-function, and/or low fabrication cost. Data storage devices among the semiconductor devices can store logic data. The data storage devices have become increasingly integrated with the development of the electronic industry. As a result, line widths of components constituting the data storage devices continue to decrease.

Additionally, high reliability has been demanded with the high integration of the data storage devices. However, the high integration may deteriorate the reliability of the data storage devices. Therefore, various research has been conducted for enhancing the reliability of the data storage devices.

SUMMARY

Various embodiments of present inventive concepts provide a data storage device and a method for manufacturing the same having enhanced electrical characteristics.

Various embodiments of present inventive concepts provide a data storage device and a method for manufacturing the same having a superior reliability.

A data storage device, according to some embodiments of present inventive concepts, may include a first interlayer dielectric layer on a substrate. The data storage device may include a plurality of data storage structures spaced apart from each other on the first interlayer dielectric layer. The data storage device may include a conductive layer on a top surface of the first interlayer dielectric layer between the plurality of data storage structures. The data storage device may include a capping insulation layer on the conductive layer and on the top surface of the first interlayer dielectric layer between the plurality of data storage structures. The data storage device may include a second interlayer dielectric layer that overlaps the first interlayer dielectric layer, the conductive layer, and the capping insulation layer, and that is on sidewalls of the plurality of data storage structures.

A data storage device, according to some embodiments of present inventive concepts, may include a substrate. The data storage device may include first and second contact plugs on the substrate. The data storage device may include a dielectric layer between the first and second contact plugs. The data storage device may include a conductive material on the dielectric layer. The data storage device may include first and second Magnetic Tunnel Junction (MTJ) structures on the first and second contact plugs, respectively. The first and second MTJ structures may be nearest ones of a plurality of MTJ structures to the conductive material. Moreover, the data storage device may include an insulating layer between the conductive material and the first and second MTJ structures.

A magnetic memory device, according to some embodiments of present inventive concepts, may include a substrate. The magnetic memory device may include first and second stacks of magnetic memory layers on the substrate. The magnetic memory device may include a conductive region separated from the substrate and the first and second stacks by at least one insulating material. The conductive region may contact only the at least one insulating material. Moreover, the conductive region may be closer than the magnetic memory layers to the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Present inventive concepts will be discussed by explaining example embodiments thereof in conjunction with the accompanying drawings.

Figure 1:
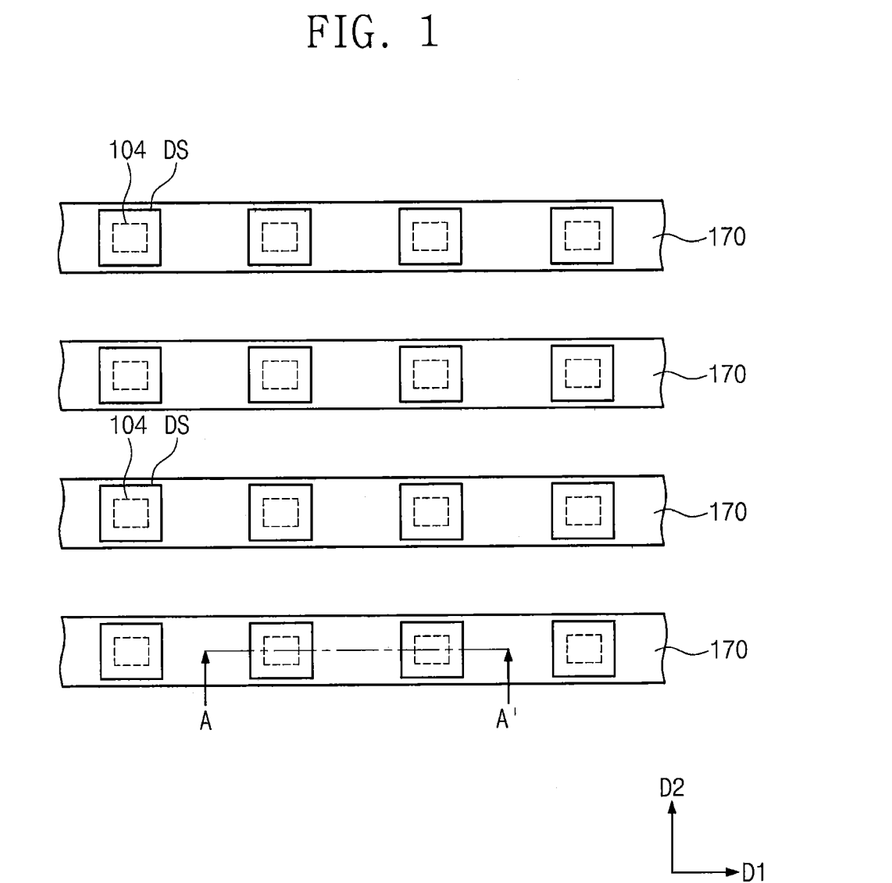
FIG. 1 is a plan view illustrating a data storage device according to some example embodiments of present inventive concepts.
Figure 2:
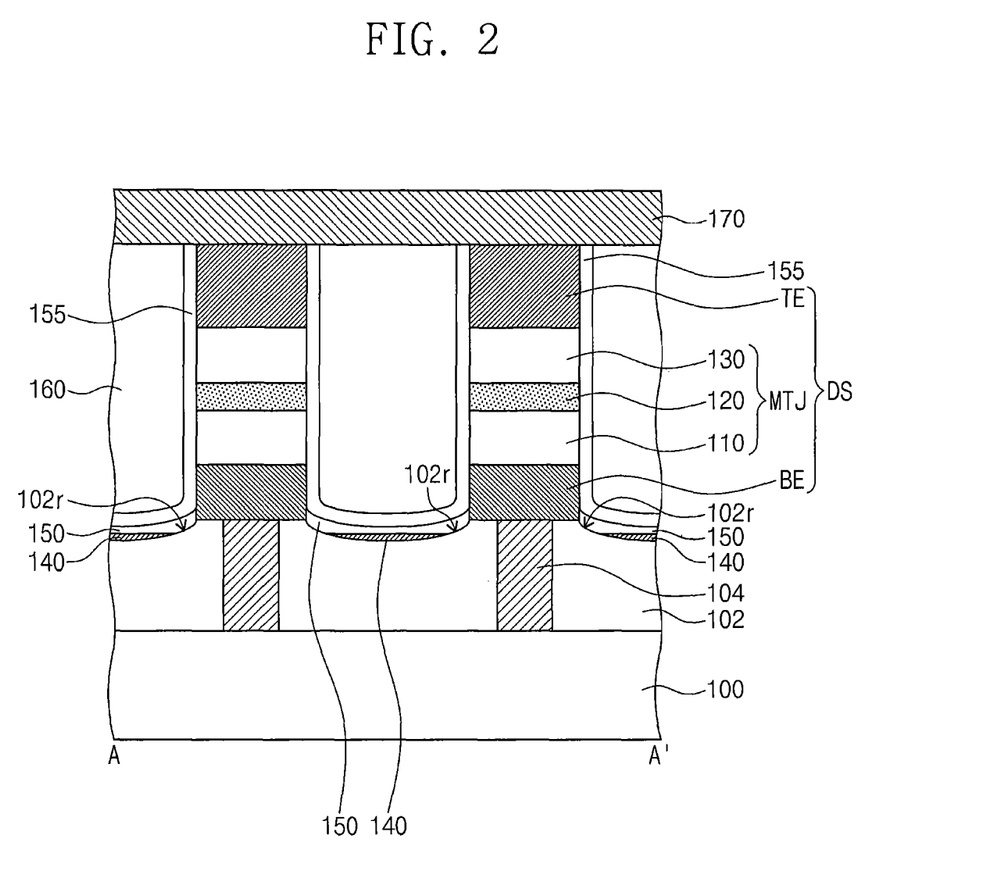
FIG. 2 is a cross-sectional view taken along line A-A' of FIG. 1.

FIG. 1 is a plan view illustrating a data storage device according to some example embodiments of present inventive concepts, and FIG. 2 is a cross-sectional view taken along line A-A' of FIG. 1.

Referring to FIGS. 1 and 2, a first interlayer dielectric layer 102 may be provided on a substrate 100. The substrate 100 may be a semiconductor substrate including silicon, silicon on insulator (SOI), silicon-germanium (SiGe), germanium (Ge), gallium-arsenic (GaAs), etc. Select devices may be provided on the substrate 100, and the first interlayer dielectric layer 102 may cover the select devices. The select devices may be field effect transistors or diodes. The first interlayer dielectric layer 102 may include oxide, nitride, and/or oxynitride.

Lower contact plugs 104 may be provided in the first interlayer dielectric layer 102. Each of the lower contact plugs 104 may penetrate the first interlayer dielectric layer 102 and thus be electrically connected to one terminal of a corresponding one of the select devices. The lower contact plugs 104 may include at least one of doped semiconductor material (e.g., doped silicon), metal (e.g., tungsten, titanium, and/or tantalum), conductive metal nitride (e.g., titanium nitride, tantalum nitride, and/or tungsten nitride), and metal-semiconductor compound (e.g., metal silicide). In some embodiments, the lower contact plugs 104 may have top surfaces substantially coplanar with a top surface of the first interlayer dielectric layer 102. The first interlayer dielectric layer 102 may be referred to as "a dielectric layer between" (in the first direction D1) the lower contact plugs 104.

Data storage structures DS may be provided on the first interlayer dielectric layer 102. As viewed in a plan view, the data storage structures DS may be two-dimensionally arranged along a first direction D1 and a second direction D2 crossing the first direction D1. The data storage structures DS may be respectively coupled to the lower contact plugs 104. Each of the data storage structures DS may include a magnetic tunnel junction pattern MTJ (e.g., an MTJ structure including a stack of magnetic layers), a bottom electrode BE between (in a third direction perpendicular to the first direction D1 and the second direction D2) the magnetic tunnel junction pattern MTJ and each of the lower contact plugs 104, and a top electrode TE spaced apart from the bottom electrode BE across the magnetic tunnel junction pattern MTJ. Accordingly, the data storage device may be referred to as a magnetic memory device. The magnetic tunnel junction pattern MTJ is interposed between (in the third direction) the bottom electrode BE and the top electrode TE that are sequentially stacked on each of the lower contact plugs 104. In some embodiments, the bottom electrode BE may be in direct contact with each of the lower contact plugs 104. The bottom electrode BE and the top electrode TE may include a conductive material. For example, the bottom electrode BE and the top electrode TE may include conductive metal nitride (e.g., titanium nitride or tantalum nitride).

The magnetic tunnel junction pattern MTJ may include a first magnetic pattern 110, a tunnel barrier 120, and a second magnetic pattern 130 that are sequentially stacked on the bottom electrode BE. The first magnetic pattern 110 may be provided between the bottom electrode BE and the tunnel barrier 120, and the second magnetic pattern 130 may be provided between the tunnel barrier 120 and the top electrode TE. The first magnetic pattern 110 and the second magnetic pattern 130 may be spaced apart from each other across the tunnel barrier 120.

Figure 10:
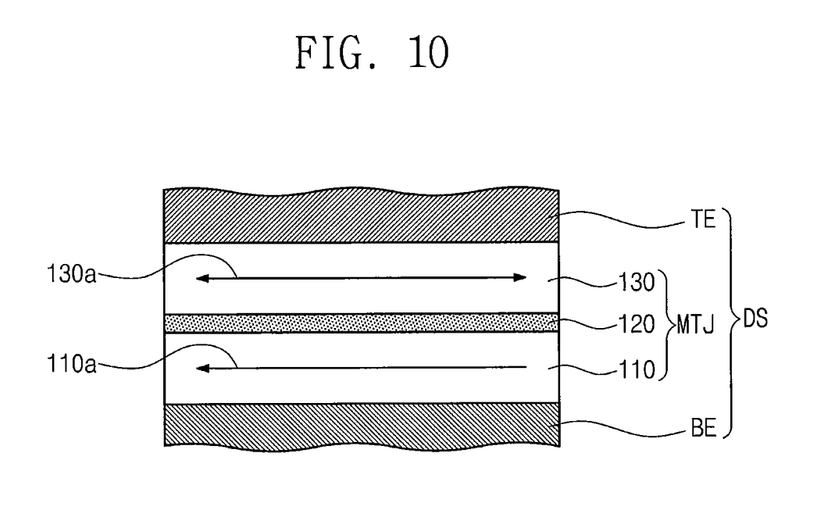
FIG. 10 is a cross-sectional view for explaining an example of a magnetic tunnel junction pattern according to some example embodiments of present inventive concepts.
Figure 11:
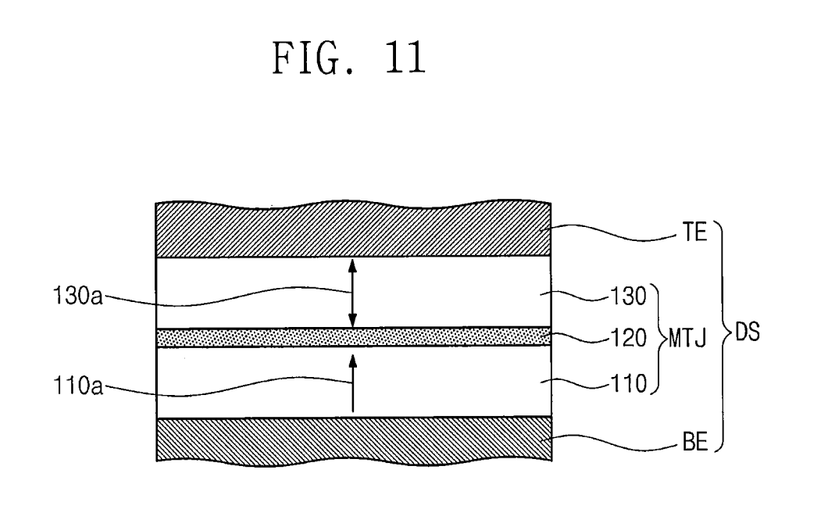
FIG. 11 is a cross-sectional view for explaining other example of a magnetic tunnel junction pattern according to some example embodiments of present inventive concepts.

Referring now to FIGS. 10 and 11, FIG. 10 is a cross-sectional view for explaining an example of a magnetic tunnel junction pattern according to some example embodiments of present inventive concepts, and FIG. 11 is a cross-sectional view for explaining an example of a magnetic tunnel junction pattern according to some example embodiments of present inventive concepts.

For example, as shown in FIG. 10, the first magnetic pattern 110 may be a reference layer having a magnetization direction 110a that is unidirectionally fixed, and the second magnetic pattern 130 may be a free layer having a variable magnetization direction 130a that can be changed to be parallel or anti-parallel to the magnetization direction 110a of the first magnetic pattern 110. The magnetization directions 110a and 130a of the first and second magnetic patterns 110 and 130 may be substantially parallel to a contact surface between the tunnel barrier 120 and the second magnetic pattern 130. FIG. 10 shows an example in which the first magnetic pattern 110 is the reference layer and the second magnetic pattern 130 is the free layer, but present inventive concepts are not limited thereto. Differently from that shown in FIG. 10, the first magnetic pattern 110 may be the free layer and the second magnetic pattern 130 may be the reference layer. The reference layer may have a thickness greater than a thickness of the free layer, or may have a coercive force greater than a coercive force of the free layer.

A ferromagnetic material may be included in the first and second magnetic patterns 110 and 130 having the parallel magnetic directions 110a and 130a. The first magnetic pattern 110 may further include an anti-ferromagnetic material for fixing a magnetization direction of the ferromagnetic material in the first magnetic pattern 110.

Alternatively, as shown in FIG. 11, the first magnetic pattern 110 may be a reference layer having a magnetization direction 110a that is unidirectionally fixed, and the second magnetic pattern 130 may be a free layer having a magnetization direction 130a that can be changed to be parallel or anti-parallel to the magnetization direction 110a of the first magnetic pattern 110. The magnetization directions 110a and 130a of the first and second magnetic patterns 110 and 130 may be substantially perpendicular to a contact surface between the tunnel barrier 120 and the second magnetic pattern 130. FIG. 11 shows an example in which the first magnetic pattern 110 is the reference layer and the second magnetic pattern 130 is the free layer, but differently from that shown in FIG. 11, the first magnetic pattern 110 may be the free layer and the second magnetic pattern 130 may be the reference layer.

The first and second magnetic patterns 110 and 130 having the perpendicular magnetization directions 110a and 130a may include at least one of a perpendicular magnetic material (e.g., Cobalt Iron Terbium (CoFeTb), Cobalt Iron Gadolinium (CoFeGd), Cobalt Iron Dysprosium (CoFeDy)), a perpendicular magnetic material having an L10 structure, Cobalt Platinum (CoPt) of a hexagonal close packed (HCP) lattice structure, and a perpendicular magnetic structure. The perpendicular magnetic material having the L10 structure may include at least one of Iron Platinum (FePt) of the L10 structure, Iron Palladium (FePd) of the L10 structure, Cobalt Palladium (CoPd) of the L10 structure, and CoPt of the L10 structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Nickel (Ni))n, (CoNi/Pt)n, (Cobalt Chromium (CoCr)/Pt)n, and (CoCr/Pd)n (where, n is the number of stacking).

Referring back to FIGS. 1 and 2, a conductive layer 140 may be provided on the first interlayer dielectric layer 102 between the data storage structures DS. The conductive layer 140 may be provided on and in contact with a top surface of the first interlayer dielectric layer 102 between the data storage structures DS. In some embodiments, the top surface of the first interlayer dielectric layer 102 may be a recessed surface 102r that is recessed toward the substrate 100 between the data storage structures DS. The conductive layer 140 may be locally provided on the recessed surface 102r. The conductive layer 140 may include an element that is the same as that constituting the top electrode TE and/or the magnetic tunnel junction pattern MTJ. For example, the conductive layer 140 may include a metal element that is the same as that constituting the top electrode TE and/or the magnetic tunnel junction pattern MTJ. The two magnetic tunnel junction patterns MTJ that are illustrated in FIG. 2 may be the closest/nearest ones of all of the magnetic tunnel junction patterns MTJ to the conductive layer 140. Moreover, although the conductive layer 140 is referred as a "layer," it is not limited to a layer, but rather may be any conductive material or conductive region that is between the first interlayer dielectric layer 102 and a capping insulation layer 150.

The capping insulation layer 150 may be provided on the first interlayer dielectric layer 102 between the data storage structures DS and thus the conductive layer 140 may be covered with the capping insulation layer 150. The capping insulation layer 150 may be provided on the top surface of the first interlayer dielectric layer 102 between the data storage structures DS. The conductive layer 140 may be interposed between the first interlayer dielectric layer 102 and the capping insulation layer 150, and at least a portion of the capping insulation layer 150 may be in contact with the top surface of the first interlayer dielectric layer 102. The capping insulation layer 150 may extend along a surface of the conductive layer 140 and the top surface of the first interlayer dielectric layer 102. In some embodiments, the capping insulation layer 150 may extend along the surface of the conductive layer 140 and the top surface of the first interlayer dielectric layer 102 and therefore may cover a sidewall of at least one of the data storage structures DS. In the event that the top surface of the first interlayer dielectric layer 102 is the recessed surface 102r, the capping insulation layer 150 may be locally provided on the recessed surface 102r and may extend along the recessed surface 102r and the surface of the conductive layer 140. As viewed in a sectional view, the conductive layer 140 may be surrounded by the first interlayer dielectric layer 102 and the capping insulation layer 150. In other words, the conductive layer 140 may be sealed with (e.g., may contact only) the first interlayer dielectric layer 102 and the capping insulation layer 150. The capping insulation layer 150 may be one of a hydrogen-free dielectric layer, a chlorine-free dielectric layer, and an oxygen-free dielectric layer. For example, the capping insulation layer 150 may be a silicon nitride layer.

In some embodiments, the capping insulation layer 150 may be referred to as an "insulating layer" or an "insulating material." Moreover, in some embodiments, at least one of the first interlayer dielectric layer 102 and the capping insulation layer 150 may be referred to as "at least one insulating material" that separates the conductive layer/region 140 from the substrate 100 and from the data storage structures DS. For example, the words "at least one insulating material" may refer to a combination of the first interlayer dielectric layer 102 and the capping insulation layer 150 that separates the conductive layer/region 140 from the substrate 100 and from the magnetic tunnel junction patterns MTJ. In some embodiments, the conductive layer/region 140 may only contact the at least one of the first interlayer dielectric layer 102 and the capping insulation layer 150. As an example, the capping insulation layer 150 and the first interlayer dielectric layer 102 may be referred to as respective "first and second insulating regions" that contact uppermost and lowermost surfaces, respectively, of the conductive layer/region region 140.

A second interlayer dielectric layer 160 may be provided on the first interlayer dielectric layer 102 and may cover the data storage structures DS. The second interlayer dielectric layer 160 may cover the conductive layer 140, the capping insulation layer 150, and sidewalls of the data storage structures DS. The capping insulation layer 150 may separate the conductive layer 140 from the second interlayer dielectric layer 160. In other words, the conductive layer 140 may be spaced apart from the second interlayer dielectric layer 160 with the capping insulation layer 150 interposed therebetween. A protection insulation layer 155 may be interposed between the second interlayer dielectric layer 160 and the sidewall of each of the data storage structures DS. The protection insulation layer 155 may extend between the capping insulation layer 150 and the second interlayer dielectric layer 160. The capping insulation layer 150 may separate the conductive layer 140 from the protection insulation layer 155. In other words, the conductive layer 140 may be spaced apart from the protection insulation layer 155 with the capping insulation layer 150 interposed therebetween. The second interlayer dielectric layer 160 may be a single layer or multiple layers, and may include, for example, an oxide layer (e.g., a silicon oxide layer), a nitride layer (e.g., a silicon nitride layer), and/or an oxynitride layer (e.g., a silicon oxynitride layer). The protection insulation layer 155 may include, for example, a nitride layer (e.g., a silicon nitride layer).

Electrical lines 170 may be provided on the second interlayer dielectric layer 160. As viewed in a plan view (e.g., FIG. 1), the electrical lines 170 may extend in the first direction D1 and be arranged in the second direction D2. Each of the electrical lines 170 may be electrically connected to a plurality of the data storage structures DS arranged in the first direction D1. The magnetic tunnel junction pattern MTJ of each of the data storage structures DS may be connected to a corresponding one of the electrical lines 170 through the top electrode TE. In some embodiments, the electrical lines 170 may serve as a bit line.

FIGS. 3 to 7 are figures, corresponding to cross-sectional views taken along line A-A' of FIG. 1, for explaining a method for manufacturing a data storage device according to some example embodiments of present inventive concepts.

Figure 3:
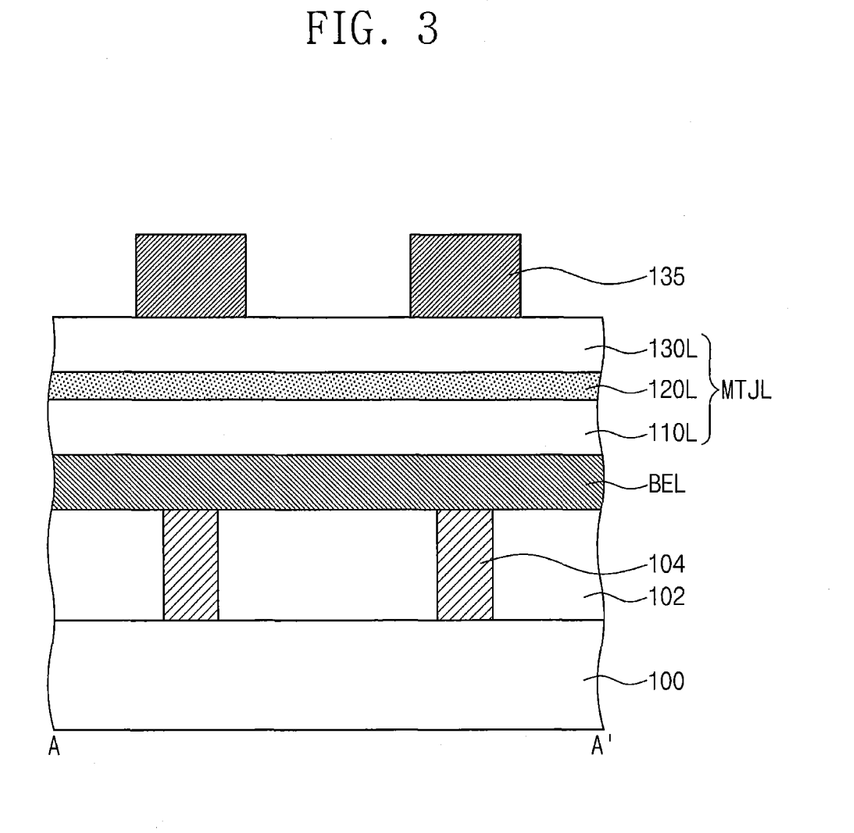
FIGS. 3 to 7 are figures, corresponding to cross-sectional views taken along line A-A' of FIG. 1, for explaining a method for manufacturing a data storage device according to some example embodiments of present inventive concepts.

Referring to FIG. 3, a first interlayer dielectric layer 102 may be formed on a substrate 100. The substrate 100 may include a semiconductor substrate. For example, the substrate 100 may include a silicon substrate, a germanium substrate, or a silicon-germanium substrate. In some embodiments, select devices may be formed on the substrate 100, and the first interlayer dielectric layer 102 may formed to cover the select devices. The select devices may be field effect transistors. Alternatively, the select devices may be diodes. The first interlayer dielectric layer 102 may be formed as a single layer or multiple layers including oxide, nitride, and/or oxynitride.

Lower contact plugs 104 may be formed in the first interlayer dielectric layer 102. Each of the lower contact plugs 104 may penetrate the first interlayer dielectric layer 102 and thus be electrically connected to one terminal of a corresponding one of the select devices. The lower contact plugs 104 may include at least one of doped semiconductor material (e.g., doped silicon), metal (e.g., tungsten, titanium, and/or tantalum), conductive metal nitride (e.g., titanium nitride, tantalum nitride, and/or tungsten nitride), and metal-semiconductor compound (e.g., metal silicide).

A magnetic tunnel junction layer MTJL may be formed on the first interlayer dielectric layer 102, and a bottom electrode layer BEL may be formed between the first interlayer dielectric layer 102 and the magnetic tunnel junction layer MTJL. The bottom electrode layer BEL may include conductive metal nitride such as titanium nitride and/or tantalum nitride. The bottom electrode layer BEL may include a material to assist crystal growth of magnetic layers constituting the magnetic tunnel junction layer MTJL. The bottom electrode layer BEL may be formed by a sputtering process, a chemical vapor deposition process, or an atomic layer deposition process.

The magnetic tunnel junction layer MTJL may include a first magnetic layer 110L, a tunnel barrier layer 120L, and a second magnetic layer 130L that are sequentially stacked on the bottom electrode layer BEL. One of the first and second magnetic layers 110L and 130L may correspond to a reference layer having a unidirectionally fixed magnetization direction, and the other of the first and second magnetic layers 110L and 130L may correspond to a free layer having a magnetization direction that can be changed to be parallel or anti-parallel to the fixed magnetization direction.

For example, the magnetization directions of the reference and free layers may be substantially perpendicular to an interface between the tunnel barrier layer 120L and the second magnetic layer 130L. In this case, the reference and free layers may include at least one of a perpendicular magnetic material (e.g., CoFeTb, CoFeGd, CoFeDy), a perpendicular magnetic material having an L10 structure, CoPt of a hexagonal close packed (HCP) lattice structure, and a perpendicular magnetic structure. The perpendicular magnetic material having the L10 structure may include at least one of FePt of the L10 structure, FePd of the L10 structure, CoPd of the L10 structure, and CoPt of the L10 structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the number of stacking). Herein, the reference layer may have a thickness greater than a thickness of the free layer, or may have a coercive force greater than a coercive force of the free layer.

Alternatively, the magnetization directions of the reference and free layers may be substantially parallel to an interface between the tunnel barrier layer 120L and the second magnetic layer 130L. In this case, the reference and free layers may include a ferromagnetic material. The reference layer may further include an anti-ferromagnetic material for fixing a magnetization direction of the ferromagnetic material in the reference layer.

The tunnel barrier layer 120L may include at least one of a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer.

Each of the first magnetic layer 110L, the tunnel barrier layer 120L, and the second magnetic layer 130L may be formed by a physical vapor deposition or a chemical vapor deposition.

Conductive mask patterns 135 may be formed on the magnetic tunnel junction layer MTJL. The conductive mask patterns 135 may include at least one of tungsten, titanium, tantalum, aluminum, and metal nitride (e.g., titanium nitride or tantalum nitride). The conductive mask patterns 135 may define regions on which magnetic tunnel junction patterns, which will be discussed later, are formed.

Figure 4:
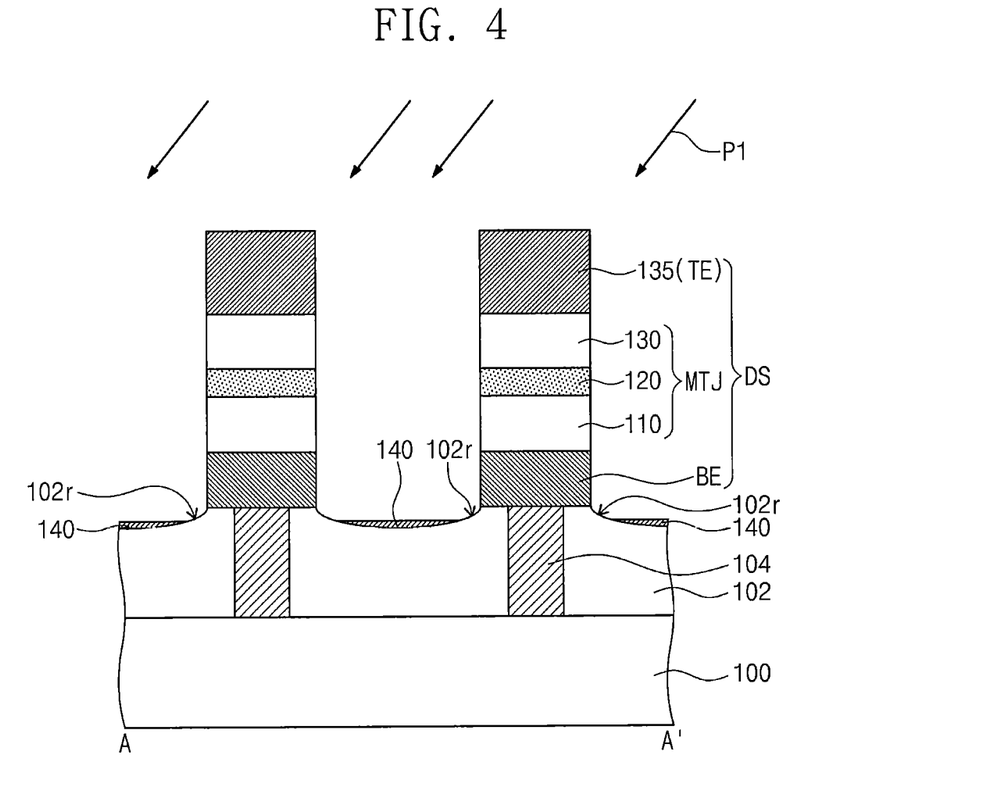

Referring to FIG. 4, a first etch process P1 may be performed to etch the magnetic tunnel junction layer MTJL using the conductive mask patterns 135 as an etch mask, so that magnetic tunnel junction patterns MTJ may be formed. A sputtering technique may be used to perform the first etch process P1. For example, the first etch process P1 may be carried out using an ion beam including argon ions (Ar+). The first etch process P1 may etch the magnetic tunnel junction layer MTJL, and thus the magnetic tunnel junction patterns MTJ may be formed horizontally spaced apart from each other on the substrate 100. The first etch process P1 may also etch the bottom electrode layer BEL, and therefore bottom electrodes BE may be formed horizontally spaced apart from each other on the substrate 100. The bottom electrodes BE may be respectively electrically connected to the lower contact plugs 104 formed in the first interlayer dielectric layer 102. In some embodiments, each of the bottom electrodes BE may have a bottom surface in contact with a top surface of each of the lower contact plugs 104.

The magnetic tunnel junction patterns MTJ may be respectively formed on the bottom electrodes BE. Each of the magnetic tunnel junction patterns MTJ may include a first magnetic pattern 110, a tunnel barrier 120, and a second magnetic pattern 130 that are sequentially stacked on each of the bottom electrodes BE. The conductive mask patterns 135 may function as top electrodes. TE. A data storage structure DS may be defined to include each of the bottom electrodes BE, each of the magnetic tunnel junction patterns MTJ, and each of the top electrodes TE. As shown in FIG. 1, a plurality of the data storage structures DS may be two-dimensionally arranged along the first and second directions D1 and D2.

In some embodiments, the first etch process P1 may recess an upper portion of the first interlayer dielectric layer 102 between the data storage structures DS. Accordingly, a top surface of the first interlayer dielectric layer 102 between the data storage structures DS may be a recessed surface 102r that is recessed toward the substrate 100.

An etch byproduct may be generated from the conductive mask patterns 135 and the magnetic tunnel junction layer MTJL during the first etch process P1, and the etch byproduct may be deposited on the first interlayer dielectric layer 102 between the data storage structures DS. Thus, a conductive layer 140 may be formed on the first interlayer dielectric layer 102 between the data storage structures DS. The conductive layer 140 may include an element that is the same as that constituting the conductive mask patterns 135 (i.e., the top electrodes TE) and/or the magnetic tunnel junction patterns MTJ. For example, the conductive layer 140 may include a metal element that is the same as that constituting the conductive mask patterns 135 (i.e., the top electrodes TE) and/or the magnetic tunnel junction patterns MTJ. In case that the recessed surface 102r corresponds to the top surface of the first interlayer dielectric layer 102 between the data storage structures DS, the conductive layer 140 may be locally formed on the recessed surface 102r.

Figure 5:
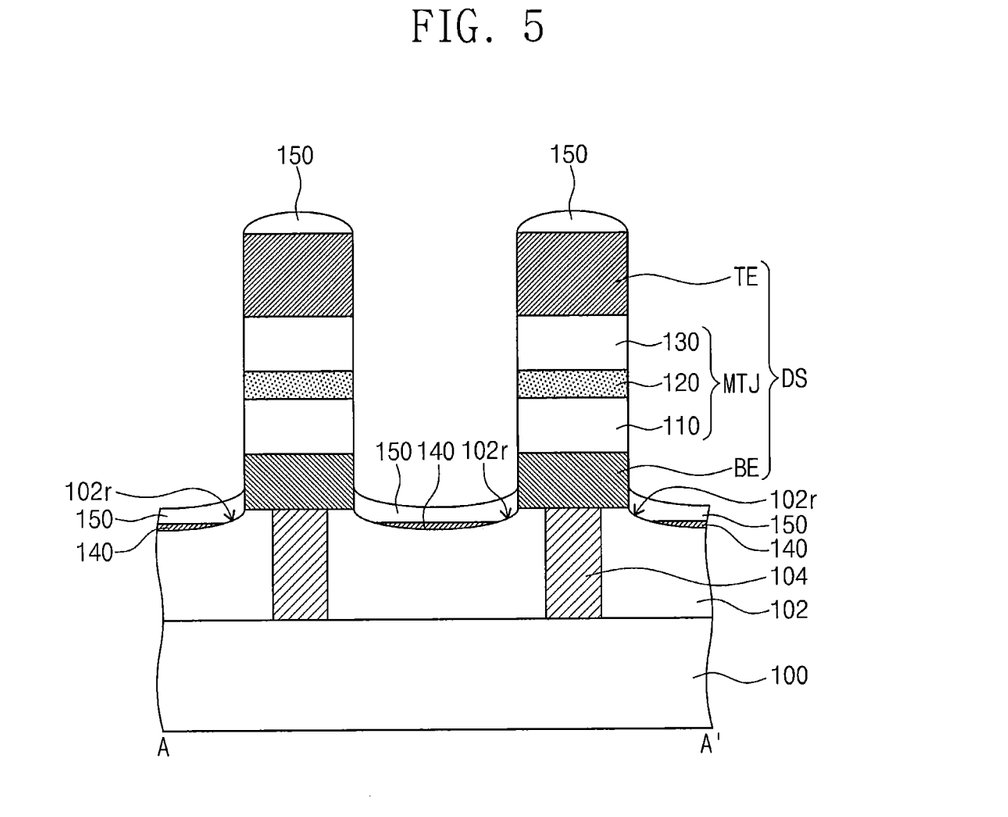

Referring to FIG. 5, after the conductive layer 140 is formed, a capping insulation layer 150 may be formed on the first interlayer dielectric layer 102. The capping insulation layer 150 may be formed to cover top surfaces of the top electrodes TE, and may be formed on the top surface of the first insulation layer 102 to cover the conductive layer 140. The capping insulation layer 150 may be formed to completely cover a surface of the conductive layer 140. Therefore, as viewed in a sectional view, the conductive layer 140 may be surrounded by the first interlayer dielectric layer 102 and the capping insulation layer 150. In other words, the conductive layer 140 may be sealed with the first interlayer dielectric layer 102 and the capping insulation layer 150. The capping insulation layer 150 may be formed by performing a deposition process having a poor step coverage. The capping insulation layer 150 may therefore be formed to expose at least a portion of a sidewall of each of the data storage structures DS. For example, the capping insulation layer 150 may be formed by performing a physical vapor deposition (PVD) process or an ion beam deposition (IBD) process. The capping insulation layer 150 may be one of a hydrogen-free dielectric layer, a chlorine-free dielectric layer, and an oxygen-free dielectric layer. For example, the capping insulation layer 150 may be a silicon nitride layer.

Figure 6:
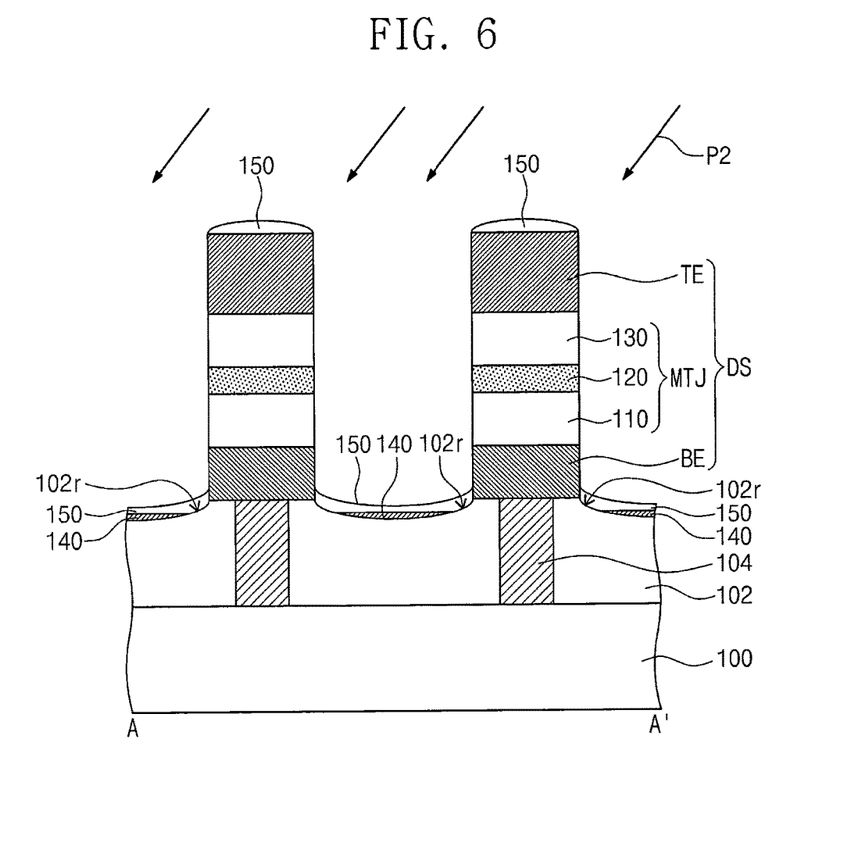

Referring to FIG. 6, after the capping insulation layer 150 is formed, a second etch process P2 may be carried out on the substrate 100. In detail, at least a portion of the etch byproduct generated by the first etch process P1 may be deposited on sidewalls of the magnetic tunnel junction patterns MTJ, and the etch byproduct may include a conductive material. In this case, the etch byproduct deposited on the sidewall of each of the magnetic tunnel junction patterns MTJ may cause an electrical short between the first magnetic pattern 110 and the second magnetic pattern 130 that are included in each of the magnetic tunnel junction patterns MTJ. The second etch process P2 may be carried out to remove the etch byproduct deposited on the sidewalls of the magnetic tunnel junction patterns MTJ. A sputtering technique may be used to perform the second etch process P2. For example, the second etch process P2 may be carried out using an ion beam including argon ions (Ar+). Although the second etch process P2 may partially remove the capping insulation layer 150, the capping insulation layer 150 may still remain on the top surfaces of the top electrodes TE and on the first interlayer dielectric layer 102 between the data storage structures DS after the second etch process P2. The conductive layer 140 may not be exposed, but rather may be covered with the capping insulation layer 150 during the second etch process P2.

In the event that the conductive layer 14Q is exposed during the second etch process P2, the second etch process P2 may etch at least a portion of the conductive layer 140 to generate a conductive byproduct and thus the conductive byproduct may be re-deposited on the sidewalls of the magnetic tunnel junction patterns MTJ. The conductive byproduct re-deposited on the sidewall of each of the magnetic tunnel junction patterns MTJ may be a cause of an electrical short between the first magnetic pattern 110 and the second magnetic pattern 130 that are included in each of the magnetic tunnel junction patterns MTJ. In other words, in case that the conductive layer 140 is exposed during the second etch process P2, the conductive byproduct generated from the conductive layer 140 may be re-deposited on the sidewalls of the magnetic tunnel junction patterns MTJ concurrently with the removal of the etch byproduct deposited on the sidewalls of the magnetic tunnel junction patterns MTJ. That is, it may be hard to remove a conductive material (i.e., the etch byproduct and/or the conductive byproduct) deposited on the sidewalls of the magnetic tunnel junction patterns MTJ. In this case, a data storage device including the magnetic tunnel junction patterns MTJ may possibly have deteriorated electrical characteristics due to an electrical short between the first magnetic pattern 110 and the second magnetic pattern 130 that are included in each of the magnetic tunnel junction patterns MTJ.

According to present inventive concepts, the conductive layer 140 may not be exposed, but rather may be covered with the capping insulation layer 150 during the second etch process P2. In this case, it may be possible to protect/prevent the conductive layer 140 from being etched by the second etch process P2 and also to impede/prevent conductive byproduct from being generated from the conductive layer 140, thereby inhibiting the conductive byproduct from being re-deposited on the sidewalls of the magnetic tunnel junction patterns MTJ. The second etch process P2 may thus easily remove the conductive material (i.e., the etch byproduct generated by the first etch process P1) deposited on the sidewalls of the magnetic tunnel junction patterns MTJ. Accordingly, it may be advantageous to impede/minimize an electrical short between the first magnetic pattern 110 and the second magnetic pattern 130 that are included in each of the magnetic tunnel junction patterns MTJ, and to improve the electrical characteristics of the data storage device including the magnetic tunnel junction patterns MTJ. Sidewalls of the tunnel barrier 120 of the magnetic tunnel junction patterns MTJ, according to various embodiments of present inventive concepts, therefore may be free of the conductive layer 140.

Figure 7:
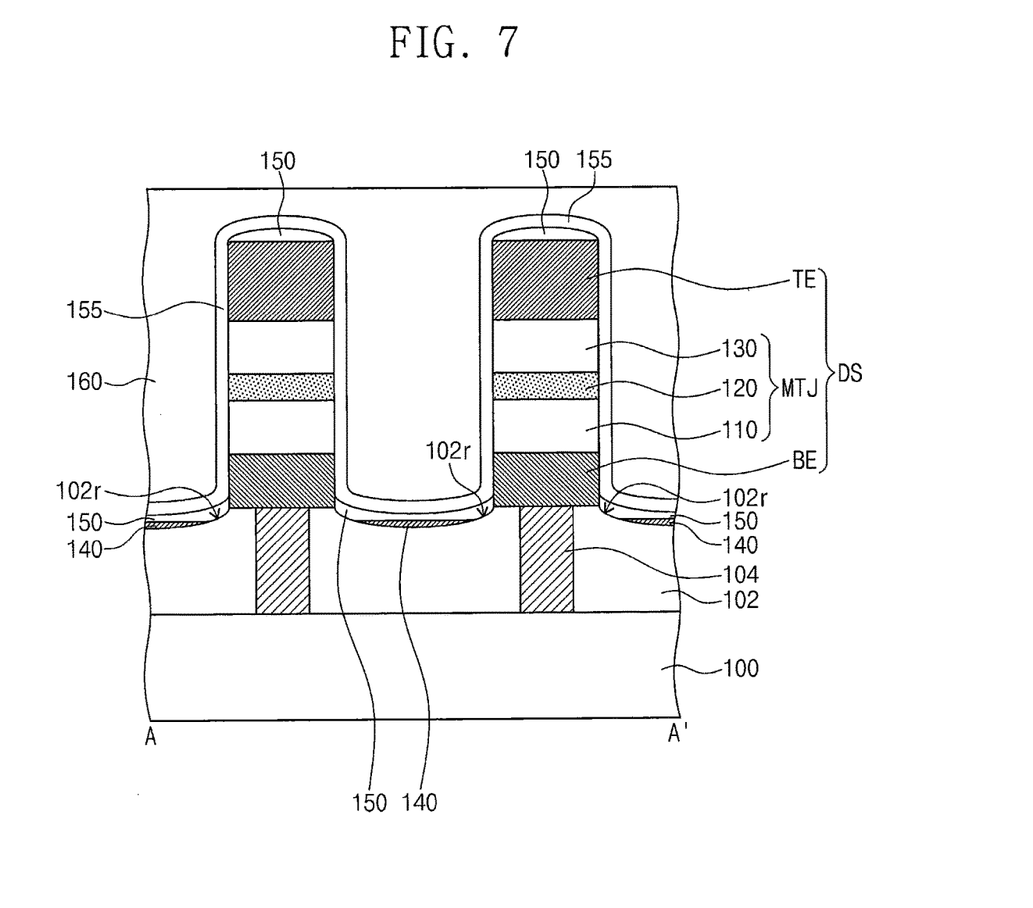

Referring to FIG. 7, a protection insulation layer 155 may be formed, on the first interlayer dielectric layer 102, to cover top surfaces and sidewalls of the data storage structures DS and extend onto the first interlayer dielectric layer 102. The capping insulation layer 150 may be interposed between the protection insulation layer 155 and the top surface of each of the data storage structures DS, and between the protection insulation layer 155 and the top surface of the first interlayer dielectric layer 102 between the data storage structures DS. The conductive layer 140 may be interposed between the capping insulation layer 150 and the top surface of the first interlayer dielectric layer 102 between the data storage structures DS. The capping insulation layer 150 may separate the conductive layer 140 from the protection insulation layer 155. The protection insulation layer 155 may be formed by a deposition process having a better step coverage than that of the deposition process for forming the capping insulation layer 150. The protection insulation layer 155 may therefore be formed to extend along the sidewalls of the data storage structures DS. The protection insulation layer 155 may include, for example, a nitride layer (e.g., a silicon nitride layer). A second interlayer dielectric layer 160 may be formed on the first interlayer dielectric layer 102 to cover the data storage structures DS. The protection insulation layer 155 may be interposed between the second interlayer dielectric layer 160 and the sidewall of each of the data storage structures DS. The protection insulation layer 155 may be interposed between the second interlayer dielectric layer 160 and the capping insulation layers 150 on the top surfaces of the data storage structures DS, and between the second interlayer dielectric layer 160 and the capping insulation layer 150 on the first interlayer dielectric layer 102 between the data storage structures DS. The conductive layer 140 may be spaced apart from the second interlayer dielectric layer 160 across the capping insulation layer 150 and the protection insulation layer 155. The second interlayer dielectric layer 160 may be a single layer or multiple layers, and may include, for example, an oxide layer (e.g., a silicon oxide layer), a nitride layer (e.g., a silicon nitride layer), and/or an oxynitride layer (e.g., a silicon oxynitride layer).

Referring back to FIG. 2, an upper portion of the second interlayer dielectric layer 160 may be removed until exposing the top electrodes TE on the data storage structures DS. The removal process may also remove portions of the protection insulation layer 155 and the capping insulation layer 150 that are provided on the top surface of each of the top electrodes TE. Thereafter, an electrical line 170 may be formed on the second interlayer dielectric layer 160. The electrical line 170 may extend in one direction and be electrically connected to a plurality of the magnetic tunnel junction patterns MTJ arranged along the one direction. Each of the magnetic tunnel junction patterns MTJ may be connected to the electrical line 170 through a corresponding one of the top electrodes TE. In some embodiments, the electrical line 170 may serve as a bit line.

Figure 8:
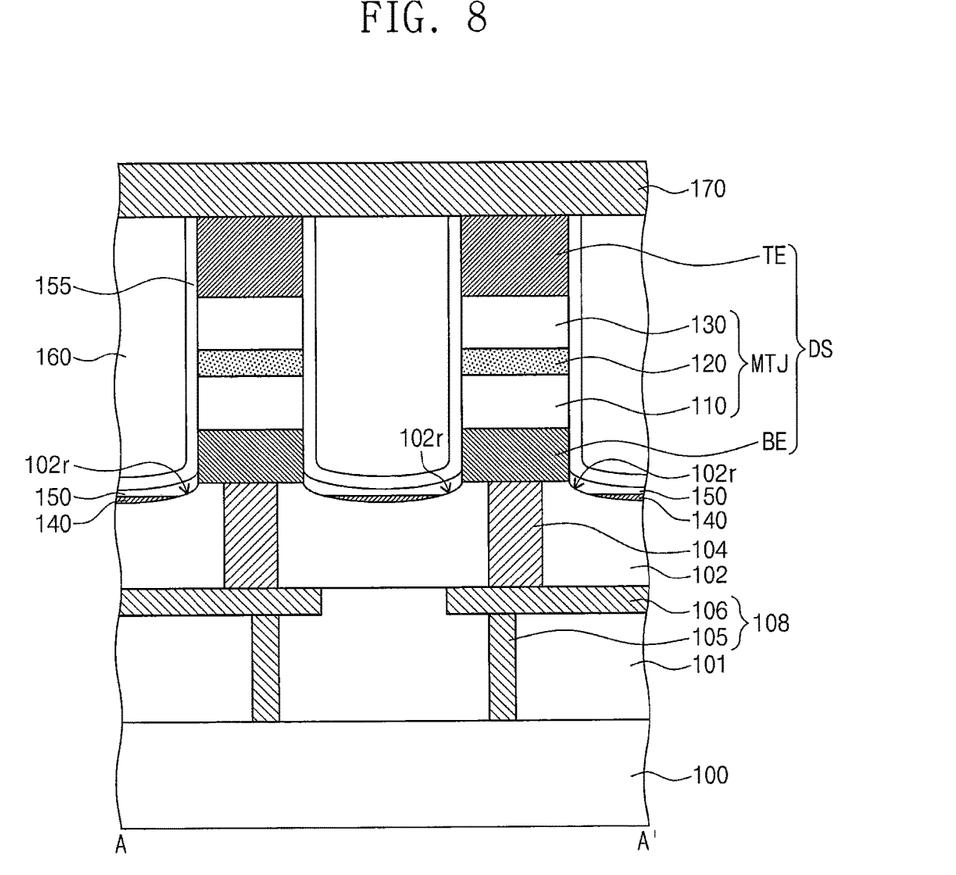
FIG. 8 is a figure, corresponding to cross-sectional views taken along line A-A' of FIG. 1, illustrating a data storage device according to some example embodiments of present inventive concepts.

FIG. 8 is a figure, corresponding to a cross-sectional view taken along line A-A' of FIG. 1, illustrating a data storage device according to some example embodiments of present inventive concepts. Elements that are substantially the same as those discussed with reference to FIGS. 1 and 2 will be allocated the same reference numerals thereto, and different elements from those discussed with reference to FIGS. 1 and 2 will be explained herein in the interest of brevity of the description.

Referring to FIGS. 1 and 8, a lower interlayer dielectric layer 101 may be provided on the substrate 100. The lower interlayer dielectric layer 101 may cover select devices provided on the substrate 100. The select devices may be field effect transistors or diodes. The lower interlayer dielectric layer 101 may include oxide, nitride, and/or oxynitride. A lower line structure 108 may be provided in the lower interlayer dielectric layer 101. The lower line structure 108 may include lower lines 106 spaced apart from the substrate 100 and contacts 105 connected to the lower lines 106. The lower lines 106 may be electrically connected to the substrate 100 through the contacts 105. In some embodiments, the lower line structure 108 may further include additional lower lines each provided between the substrate 100 and each of the contacts 105, and additional contacts, which are connected to the additional lower lines, each provided between the substrate 100 and a respective one of the additional lower lines. The lower lines 106 may be connected to the additional lower lines through the contacts 105, and the additional lower lines may be electrically connected to the substrate 100 through the additional contacts. The lower lines 106 and the contacts 105 may include a metal material. For example, the lower lines 106 and the contacts 105 may include copper (Cu). In some embodiments, the lower lines 106 may have top surfaces substantially coplanar with a top surface of the lower interlayer dielectric layer 101.

The first interlayer dielectric layer 102 may be provided on the lower interlayer dielectric layer 101, and the first interlayer dielectric layer 102 may cover the top surfaces of the lower lines 106. The lower contact plugs 104 may be provided in the first interlayer dielectric layer 102. The lower contact plugs 104 may penetrate the first interlayer dielectric layer 102 and thus be connected to the lower lines 106 of the lower line structures 108. Each of the lower contact plugs 104 may be connected to a corresponding one of the lower lines 106. Each of the lower contact plugs 104 may be in direct contact with a top surface of the corresponding one of the lower lines 106. Each of the lower contact plugs 104 may be electrically connected to one terminal of a corresponding one of the select devices through the corresponding lower line 106. The data storage structures DS may be provided on the first interlayer dielectric layer 102, and the data storage structures DS may be respectively connected to the lower contact plugs 104.

The present embodiments may be substantially the same as the embodiments discussed with reference to FIGS. 1 and 2 except that the lower line structure 108 is provided between the substrate 100 and the first interlayer dielectric layer 102.

Figure 9:
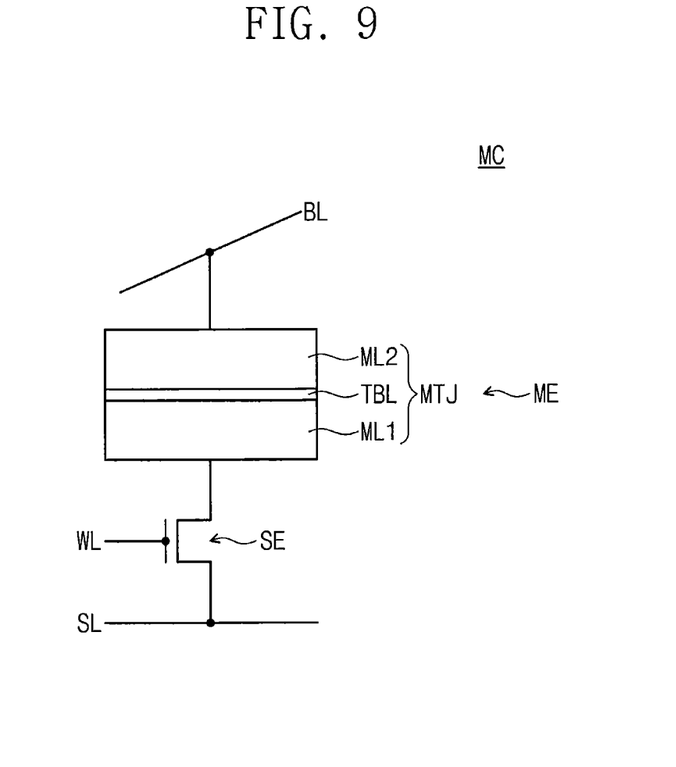
FIG. 9 is a diagram illustrating a unit memory cell of a data storage device according to some example embodiments of present inventive concepts.

FIG. 9 is a diagram illustrating a unit memory cell of a data storage device according to some example embodiments of present inventive concepts.

Referring to FIG. 9, a unit memory cell MC may include a memory element ME and its corresponding select element SE. The memory element ME and the select element SE may be electrically connected in series. The memory element ME may be connected between the select element SE and a bit line BL. The select element SE may be connected between the memory element ME and a source line SL, and controlled by a word line WL. The select element SE may be field effect transistors or diodes.

The memory element ME may include a magnetic tunnel junction MTJ composed of magnetic layers ML1 and ML2 spaced apart from each other and a tunnel barrier layer TBL between the magnetic layers ML1 and ML2. One of the magnetic layers ML1 and ML2 may be a reference layer whose magnetization direction is fixed regardless of an external magnetic field under a normal use environment. The other of the magnetic layers ML1 and ML2 may be a free layer whose magnetization direction is freely changed by the external magnetic field.

The magnetic tunnel junction MTJ may have an electrical resistance whose value is much greater when the magnetization directions of the reference and free layers are anti-parallel to each other relative to when the magnetization directions of the reference and free layers are parallel to each other. That is, the electrical resistance of the magnetic tunnel junction MTJ may be adjusted by changing the magnetization direction of the free layer. Accordingly, the memory element ME may store data in the unit memory cell MC using the difference of the electrical resistance in accordance with the magnetization directions.

In some embodiments, the conductive layer 140 may not be exposed, but rather may be covered with the capping insulation layer 150 during the second etch process P2 for removing the etch byproduct deposited on the sidewalls of the magnetic tunnel junction patterns MTJ. It may thus be possible to protect/prevent the conductive layer 140 from being etched by the second etch process P2 and also to impede/prevent the conductive byproduct from being generated from the conductive layer 140, thereby inhibiting the conductive byproduct from being re-deposited on the sidewalls of the magnetic tunnel junction patterns MTJ.

According to present inventive concepts, the conductive etch byproduct may be created by the first etch process for forming the magnetic tunnel junction patterns. At least a portion of the conductive etch byproduct may be deposited on the first interlayer dielectric layer between the magnetic tunnel junction patterns such that the conductive layer may be formed, and other portions of the conductive etch byproduct may be deposited on sidewalls of the magnetic tunnel junction patterns. The second etch process may be performed to remove the conductive etch byproduct deposited on the sidewalls of the magnetic tunnel junction patterns and, according to some embodiments, the conductive layer may not be exposed, but rather may have the capping insulation layer thereon during the second etch process. The conductive layer may thus not be etched by the second etch process so that it may be possible to impede/prevent a conductive byproduct from being generated from the conductive layer during the second etch process and being re-deposited on the sidewalls of the magnetic tunnel junction patterns. It therefore may be advantageous to reduce/minimize the likelihood of an electrical short between magnetic layers in each of the magnetic tunnel junction patterns and to improve electrical characteristics of data storage device including the magnetic tunnel junction patterns. Furthermore, the data storage device may have improved reliability.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A data storage device comprising:
   a first interlayer dielectric layer on a substrate;
   a plurality of data storage structures spaced apart from each other on the first interlayer dielectric layer;
   a conductive layer on a top surface of the first interlayer dielectric layer between the plurality of data storage structures;

a capping insulation layer on the conductive layer and on the top surface of the first interlayer dielectric layer between the plurality of data storage structures, wherein the capping insulation layer separates the conductive layer from at least one of the plurality of data storage structures; and a second interlayer dielectric layer that overlaps the first interlayer dielectric layer, the conductive layer, and the capping insulation layer, and that is on sidewalls of the plurality of data storage structures.

2. The data storage device of claim 1, wherein the conductive layer is spaced apart from the second interlayer dielectric layer by the capping insulation layer.

3. The data storage device of claim 1, wherein the conductive layer is between the first interlayer dielectric layer and the capping insulation layer.

4. The data storage device of claim 1, wherein at least a portion of the capping insulation layer directly contacts the first interlayer dielectric layer.

5. The data storage device of claim 1, further comprising a protection insulation layer between the second interlayer dielectric layer and the sidewalls of the plurality of data storage structures,
wherein the protection insulation layer extends between the capping insulation layer and the second interlayer dielectric layer.

6. The data storage device of claim 1, wherein each of the plurality of data storage structures comprises:
a magnetic tunnel junction pattern including magnetic layers;
a bottom electrode between the magnetic tunnel junction pattern and the substrate; and
a top electrode spaced apart from the bottom electrode by the magnetic tunnel junction pattern,
wherein the conductive layer comprises the same metal element as the top electrode or the magnetic layers.

7. The data storage device of claim 1, wherein the capping insulation layer comprises a hydrogen-free dielectric layer, a chlorine-free dielectric layer, or an oxygen-free dielectric layer.

8. The data storage device of claim 1, wherein the first and second interlayer dielectric layers comprise oxide, and the capping insulation layer comprises nitride.

9. The data storage device of claim 1,
wherein the top surface of the first interlayer dielectric layer comprises a recessed surface that is recessed toward the substrate, and
wherein the conductive layer and the capping insulation layer are on the recessed surface.

10. The data storage device of claim 9, wherein a bottom surface of the conductive layer contacts the first interlayer dielectric layer and a top surface of conductive layer contacts the capping insulation layer.

11. The data storage device of claim 1, wherein at least one side surface of the conductive layer directly contacts the capping insulation layer and/or the first interlayer dielectric layer.

12. A data storage device comprising:
a substrate;
first and second contact plugs on the substrate;
a dielectric layer between the first and second contact plugs;
a conductive material in a recessed portion of the dielectric layer;
first and second Magnetic Tunnel Junction (MTJ) structures on the first and second contact plugs, respectively, wherein the first and second MTJ structures are nearest ones of a plurality of MTJ structures to the conductive material; and
an insulating layer between the conductive material and the first and second MTJ structures.

13. The data storage device of claim 12, wherein the conductive material contacts only the dielectric layer and the insulating layer.

14. The data storage device of claim 12, wherein the first and second contact plugs extend away from the substrate beyond an uppermost surface of the conductive material.

15. The data storage device of claim 12, further comprising first and second electrodes that connect the first and second contact plugs to the first and second MTJ structures, respectively,
wherein the insulating layer contacts respective sidewalls of the first and second electrodes.

16. The data storage device of claim 12,
wherein each of the first and second MTJ structures comprises a tunnel barrier layer between first and second magnetic layers, and
wherein sidewalls of the tunnel barrier layer are free of the conductive material.

17. A magnetic memory device comprising:
a substrate;
first and second stacks of magnetic memory layers on the substrate; and
a conductive region separated from the substrate and from at least one of the first and second stacks by at least one insulating material,
wherein the conductive region contacts the at least one insulating material, and
wherein an uppermost surface of the conductive region is closer than a lowermost surface of the first stack to a surface of the substrate.

18. The magnetic memory device of claim 17, wherein the at least one insulating material comprises first and second insulating regions that contact the uppermost surface and a lowermost surface, respectively, of the conductive region.

19. The magnetic memory device of claim 18, further comprising:
first and second contacts between the first and second stacks, respectively, and the substrate;
a first electrode between the first stack and the first contact; and
a second electrode between the second stack and the second contact,
wherein the second insulating region comprises an interlayer dielectric layer between the first and second contacts.

20. The magnetic memory device of claim 19,
wherein the conductive region is in a recessed portion of the interlayer dielectric layer between the first and second contacts, and
wherein the uppermost surface of the conductive region is closer than a lowermost surface of the first electrode to the surface of the substrate.

* * * * *